United States Patent
Wang et al.

(10) Patent No.: US 7,154,141 B2
(45) Date of Patent: Dec. 26, 2006

(54) SOURCE SIDE PROGRAMMING

(75) Inventors: Hsingya Arthur Wang, San Jose, CA (US); Yuan Tang, San Jose, CA (US); Haike Dong, San Ramon, CA (US); Ming Sang Kwan, San Leandro, CA (US); Peter Rabkin, Cupertino, CA (US)

(73) Assignee: Hyundai Electronics America, San Jose, CA (US)

( * ) Notice: Subject to any disclaimer, the term of this patent is extended or adjusted under 35 U.S.C. 154(b) by 0 days.

(21) Appl. No.: 09/777,007

(22) Filed: Feb. 2, 2001

(65) Prior Publication Data

US 2002/0105036 A1    Aug. 8, 2002

(51) Int. Cl.
*H01L 29/788* (2006.01)

(52) U.S. Cl. ...................... 257/316; 257/322

(58) Field of Classification Search ........... 257/390, 257/316, 321, 335, 322, 315, 314
See application file for complete search history.

(56) References Cited

U.S. PATENT DOCUMENTS 4,185,319 A * 1/1980 Stewart ............. 365/185.01

| | | | |
|---|---|---|---|
| 5,172,338 A | 12/1992 | Mehrotra et al. | |
| 5,280,446 A | 1/1994 | Ma et al. | |
| 5,414,669 A | 5/1995 | Tedrow et al. | |
| 5,418,741 A * | 5/1995 | Gill ............. | 257/316 |
| 5,468,981 A * | 11/1995 | Hsu ............. | 257/316 |
| 5,590,076 A | 12/1996 | Haddad et al. | |

OTHER PUBLICATIONS

Samachisa, Gheorghe, et al. "A 128K Flash EEPROM Using Double-Polysilicon Technology," *IEEE Journal of Solid-State Circuits*, (Oct. 1987) vol. SC-22, N0. (5):676-683.

* cited by examiner

*Primary Examiner*—Michael Trinh
*Assistant Examiner*—Kiesha Rose
(74) *Attorney, Agent, or Firm*—Townsend and Twonsend and Crew LLP (57) ABSTRACT

A flash EEPROM array having a double-diffused source junction that can be used for source side programming. The flash EEPROM array, when programmed from the source side exhibits fast programming rates. Additionally, source side programming of arrays having different physical characteristics (e.g. transistor cell channel length) exhibit tighter program rate distributions than for the same arrays in which drain side programming is used.

20 Claims, 8 Drawing Sheets

SOURCE SIDE PROGRAMMING

BACKGROUND OF THE INVENTION

The present invention relates to the field of flash memories. More specifically, the present invention provides for an improved method and apparatus for programming and erasing flash memory cells.

A programmable read-only memory (PROM) is a type of nonvolatile memory. In other words, once data has been written into a PROM, it will remain there indefinitely, even when power to the PROM is removed. Typically, a PROM is arranged in an array of rows and columns of individual memory cells.

Although PROMs are nonvolatile, there are certain types that can be erased and reprogrammed. One of these is the electrically erasable programmable read-only memory (EEPROM or $E^2$PROM). A "flash" EEPROM is a special type of EEPROM of which a large number of cells, e.g. a block, sector or page, can be electrically erased and reprogrammed as compared to being electrically erased and reprogrammed one byte at a time, which is done in non-flash EEPROMs.

Like other PROMs, a flash EEPROM retains data written into individual cells, even in the absence of power. The ability to retain data in memory in the absence of power and the ability to rewrite data in memory is provided by a floating gate within each cell. A conventional flash memory cell is constructed as a single field-effect transistor (FET) with a floating gate interposed between a control gate and a channel region of the transistor. By altering the charge stored in the floating gate, the state of the cell can be changed back and forth between a logic "high" state and a logic "low" state, thereby s allowing one bit of information to be stored therein. The two states are referred to as a "programmed" state and an "erased" state.

To program a cell, charge is added to the floating gate. Because the floating gate is insulated from the control gate, source, and drain of the cell, any charge placed on the floating gate remains there until removed by an erase process. Although the floating gate is completely insulated, charge can be added and removed using techniques described below and other known prior art techniques.

Figure 1:
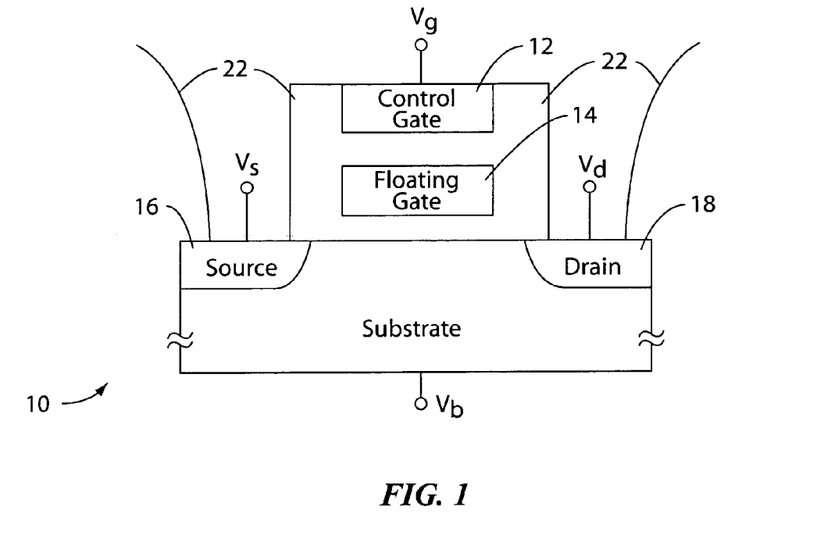
FIG. 1 shows a conventional EEPROM memory cell.

FIG. 1 shows a cell 10 with a control gate 12, a floating gate 14, a source 16 and a drain 18. Control gate 12 and floating gate 14 are separated from source 16 and drain 18, and from a substrate 11 into which the source 16 and drain 18 are formed, by an oxide 22 which may be formed by one or more layers of a suitable oxide material. Suitable openings in the oxide 22 are provided to allow for external connection to source 16 and drain 18. As shown, connections are provided to set $V_g$ (control gate voltage), $V_d$ (drain voltage), $V_s$ (source voltage) and $V_b$ (substrate voltage).

Figure 2:
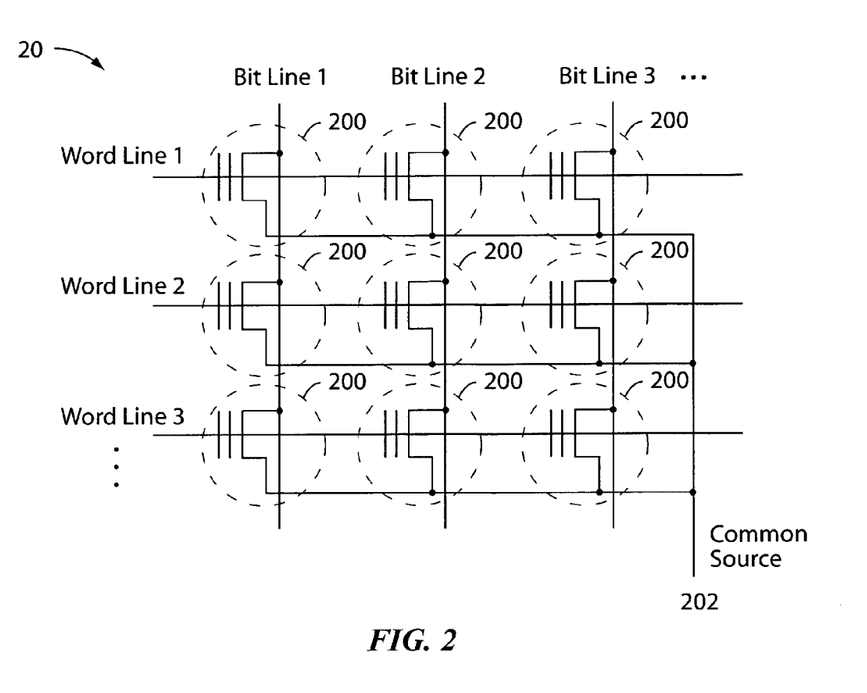
FIG. 2 shows how a plurality of conventional memory cells, each cell like the memory cell in FIG. 1, can be arranged in an array rows and columns.

FIG. 2 shows how a flash EEPROM cell is typically arranged in an array 20 of rows and columns of individual memory cells 200. By applying appropriate voltages to a given word line and given bit line, a specific cell is selected for programming or erasing. Note that under all conditions the sources of each cell are grounded as a common source 202.

To more particularly illustrate the programming of a specific cell, consider the upper left cell in FIG. 2, which is associated with the intersection of Word Line 1 and Bit Line 1. (It is assumed that all cells are in an initial erased condition and have a logic level of "1", i.e., an erased state.) To program the upper left cell, a positive voltage of, for example, approximately 8.5 volts, is applied to Word Line 1 and a positive voltage of, for example, approximately 4.5 volts, is applied to Bit Line 1. The non-selected Word and Bit Lines are either left floating or are biased to ground potential. The 4.5 volt difference between the cell's drain and source causes electrons to accelerate through the channel of the cell. With sufficient energy and with the aid of the 8.5 volts applied to the cell's gate, electrons tunnel into the floating gate of the transistor, thereby programming the cell to a logic level of "0". To leave the upper left cell in an erased state, the cell is not biased into a channel hot electron bias condition. This programming state can be satisfied, for example, by ensuring that Bit Line 1 is grounded and Word Line 1 is biased to a negative voltage.

SUMMARY OF THE INVENTION

In a first aspect of the invention, a flash memory comprises a plurality of floating gate transistors. Each transistor has a control gate a floating gate, a drain and a source. The plurality of transistors are arranged in an N-row by M-column array, where N and M are integers greater than or equal to one. The array has N word lines such that each word line connects together the control gates of transistors in a common and corresponding row and also has M bit lines such that each bit line connects together the drains of transistors in a common and corresponding column. A specific floating gate transistor of the plurality is selected and programmed by applying a first voltage to the control gates of the transistors in the row in which the specific transistor is disposed, applying a second voltage to the source of the specific transistor and grounding the drain of the specific transistor.

In a second aspect of the invention, a flash EEPROM memory array comprises a plurality of memory cells arranged in a matrix of rows and columns, each memory cell including: a portion of a semiconductor substrate of a first conductivity type; a drain region of a second conductivity type formed into said substrate; a source region of said second conductivity type formed in said substrate in spaced alignment with said drain region with a channel region therebetween, said source region having a more abrupt profile grade relative to the surface of said substrate than said drain region; a first gate insulation formed on said major surface of said substrate and having a first thickness; a floating gate electrode formed on said first gate insulation and asymmetrically located over said channel region and having a portion over both drain and source regions wherein a greater portion is over the source region than the drain region; a second gate insulation formed on said floating gate region; and having a second thickness greater than said first thickness; a control gate electrode formed on said second gate insulation and overlapping said floating gate electrode, said control gate electrode extending from said cell to adjacent cells in a column; means connecting said drain regions of said plurality of memory cells in an array of columns; means connecting said control gate electrodes of said plurality of memory cell in an array of rows, said rows substantially perpendicular to said columns; and means connecting said source regions to a common source, wherein programming of a cell to a high state is by applying a positive bias to said common source and to said means connecting said control gate electrodes associated with said cell, to inject a charge from the source region into the floating gate through the first gate insulation, and wherein erasing of a cell is by applying a high voltage to the common source when the control gate electrode is grounded and the drain region is floating.

In a third aspect of the invention, a method of programming a cell in a flash EEPROM array comprises selecting a cell for programming to a high state or a "low" state, wherein said cell is associated with one of a plurality of means connecting said control gate electrodes and one of a plurality of means connecting said drain regions; applying to said means connecting said source regions a first voltage; applying to the selected means connecting said control gate a second voltage; applying to the selected means connecting said drain regions a third voltage substantially equal to said second voltage if said floating gate transistor is to be programmed to a "high" state, and grounding said drain if said floating gate transistor is to be programmed to a "low" state; and floating all other means not associated with said selected cell.

In a fourth aspect of the invention, a method of programming a floating gate transistor disclosed. The floating gate transistor comprises a source of a first conductivity type and a drain of a second conductivity type. The source and drain are formed in a semiconductor region of a third conductivity type and spaced apart by a channel. A floating gate extends over at least a portion of the channel, and a control gate extends over at least a portion of the floating gate. The method of programming the floating gate transistor comprises the steps of: biasing the control gate of a transistor to be programmed with a first voltage; biasing the source of the transistor with a second voltage that is less than the first voltage; and applying a programming voltage to the drain of the transistor, the programming voltage being substantially equal to the second voltage to program the floating gate to a logic "1" and being substantially zero to program the floating gate to a logic "0."

A further understanding of the nature and advantages of the inventions herein may be realized by reference to the remaining portions of the specification and the attached drawings.

DESCRIPTION OF THE SPECIFIC EMBODIMENTS

Figure 3:
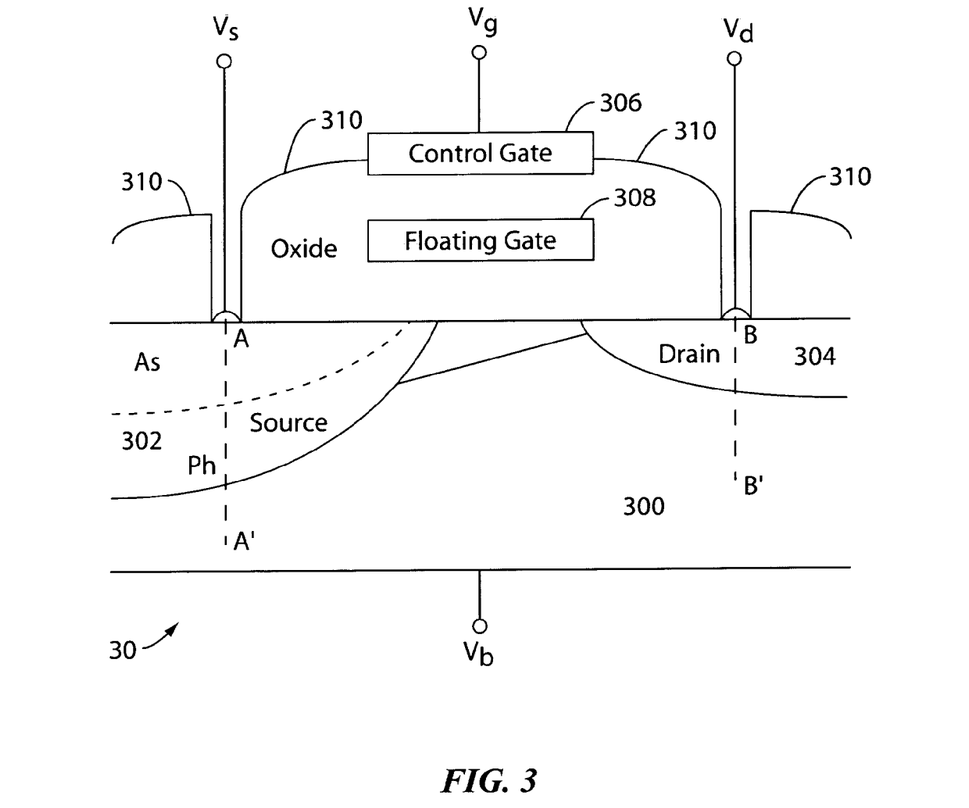
FIG. 3 shows a memory cell, which can be used in a flash EEPROM array, according to an embodiment of the present invention.
Figure 4:
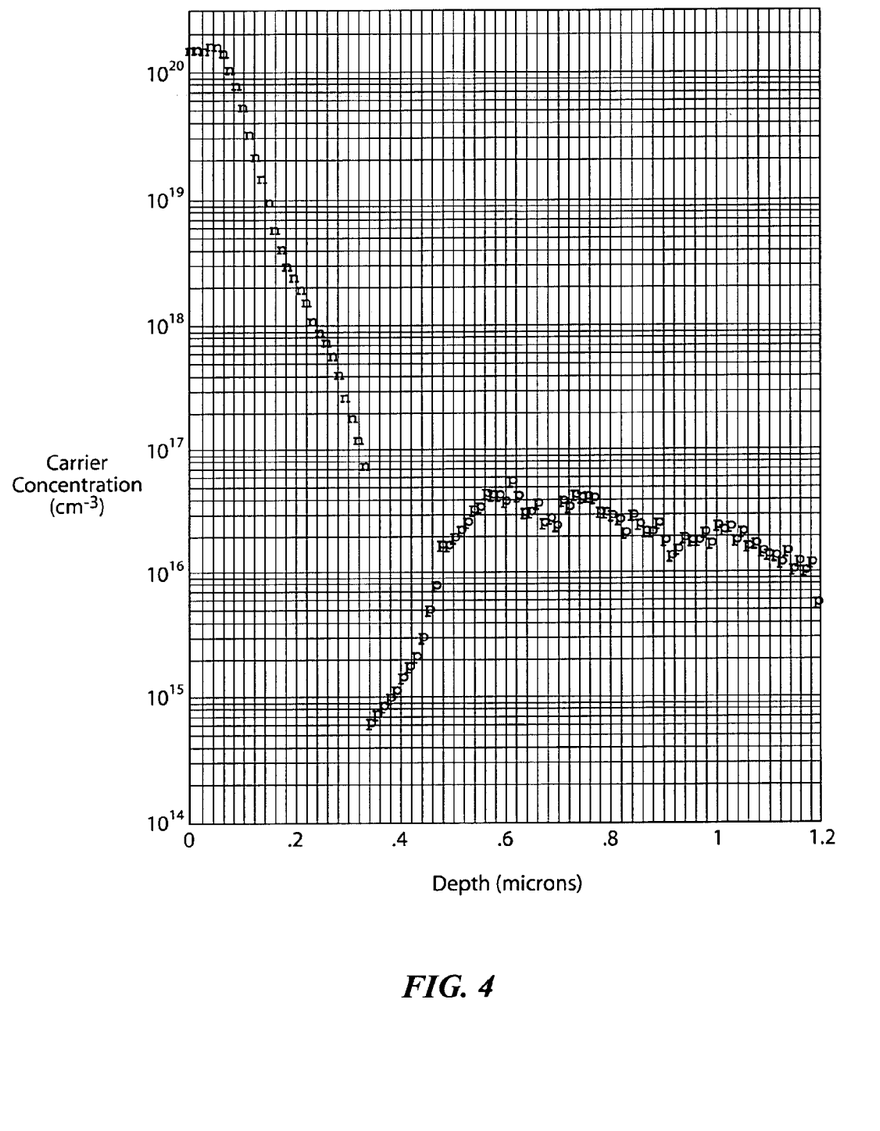
FIG. 4 shows an exemplary doping profile through the cross-section A–A' according to an embodiment of the present invention.
Figure 5:
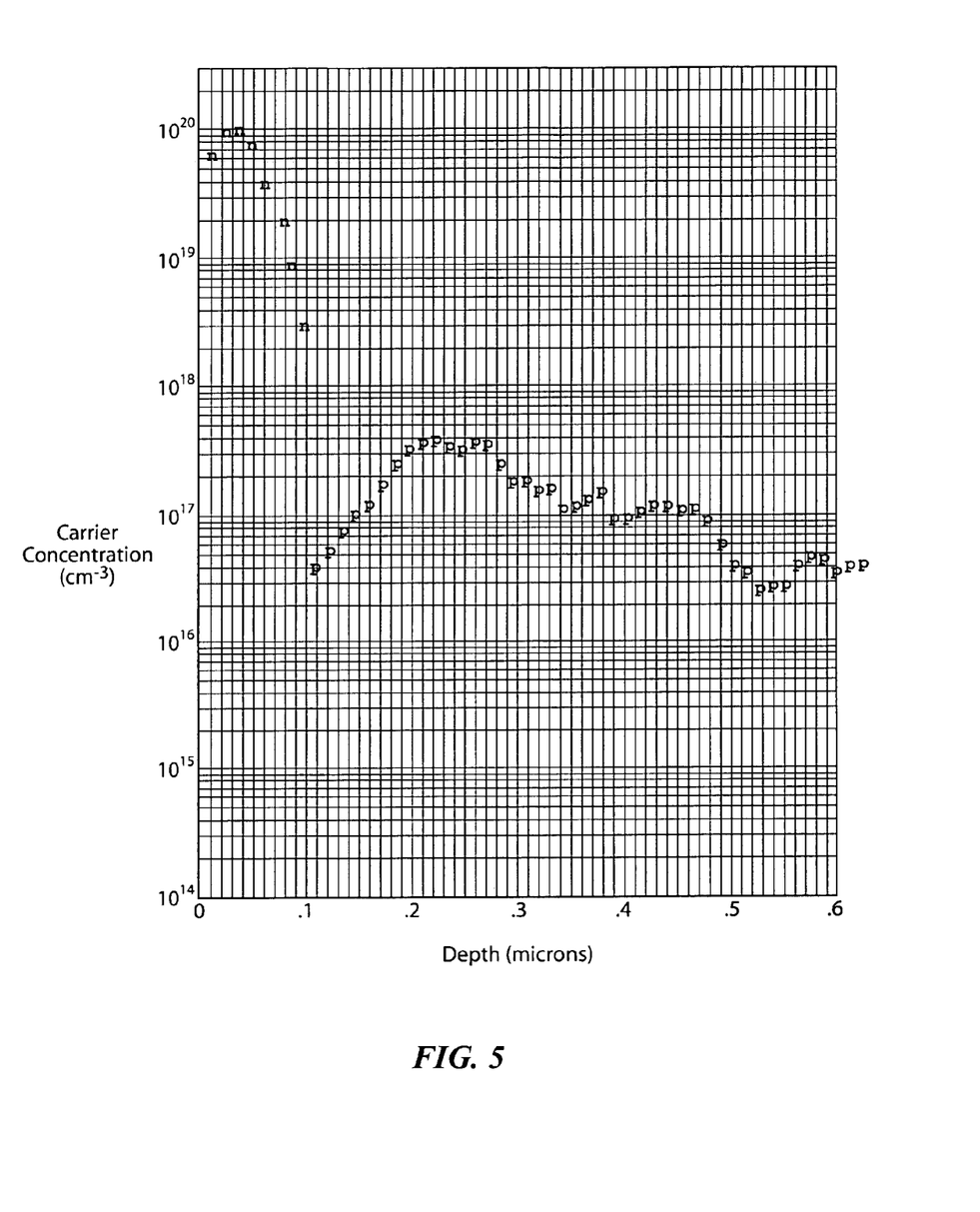
FIG. 5 shows an exemplary doping profile through the cross-section B–B' according to an embodiment of the present invention.

FIG. 3 shows a memory cell 30, which can be used in a flash EEPROM array, according to an embodiment of the present invention. The drain 304 of cell 30 is formed by, for example, an Arsenic implant and drive having a dose and at an energy of, for example, $4.0 \times 10^{15}$ $cm^{-2}$ and 40 keV, respectively. The junction formed between drain 304 and substrate 300 preferably has a substantially abrupt profile. Source 302 and drain 304 regions may be formed after formation of the memory cell's control gate 306 and floating gate 308. This can be done by applying a mask to open a source region opening through oxide layer 310. The source 302 is then preferably formed by a double-diffused junction made of, for example, an implant and drive of Phosphorous (e.g. $3.2 \times 10^{14}$ $cm^{-2}$ and 50 keV) and Arsenic (e.g. $4.0 \times 10^{15}$ $cm^{-2}$ and 60 keV). A diffusion step may then be performed (either after each implant or after the Arsenic implant only) to drive the Phosphorous and Arsenic dopants to predetermined depths. The depth of the junction formed between the Phosphorous region and substrate region 300 is, or example, about 0.3 µm. The drain region 304 is formed (either prior to or after formation of source 302) by another masking/implant/drive step to a depth of about 0.1 µm. Preferably, the source junction is formed deeper than the drain junction so that device performance is less immune to processing variations. The gate/drain overlap is also preferably made smaller than the gate/source overlap to reduce the lateral field on the source junction during erasure. The resulting maximum doping concentration of the source region is on the order of $10^{20}$ $cm^{-3}$ (Arsenic region) and $10^{19}$ $cm^{-3}$ (Phosphorous region). Exemplary doping profiles as a function of depth from the surface of substrate 300 for cross-sections A–A' and B–B' in FIG. 3 of the exemplary memory cell 30 of FIG. 3, are shown in FIGS. 4 and 5, respectively. A graded source profile may also be used to reduce the lateral field effect.

A plurality of flash EEPROM cells, similar to the one shown in FIG. 3, can be distributed in a column and row array as in FIG. 2. Whereas drain side programming, as described above in relation to FIGS. 1 and 2, can be performed with this configuration, source side programming of the array can also be performed simply by biasing the common source positive with respect to the drain so that channel hot electrons are generated, flowing in the direction from the selected cell's drain to its source, and tunnel into the floating gate. As described in more detail below, experimental data of an array having cells similar to the one shown in FIG. 3, reveals that the programming rate is faster for source side programming than it is for drain side programming. An example of bias conditions for a selected cell for source side programming would be, for example, $V_g$=8.5 volts, $V_d$=0 volts, $V_s$=4.5 volts and $V_b$=0 volts. Non-selected bit lines are left floating.

Figure 6:
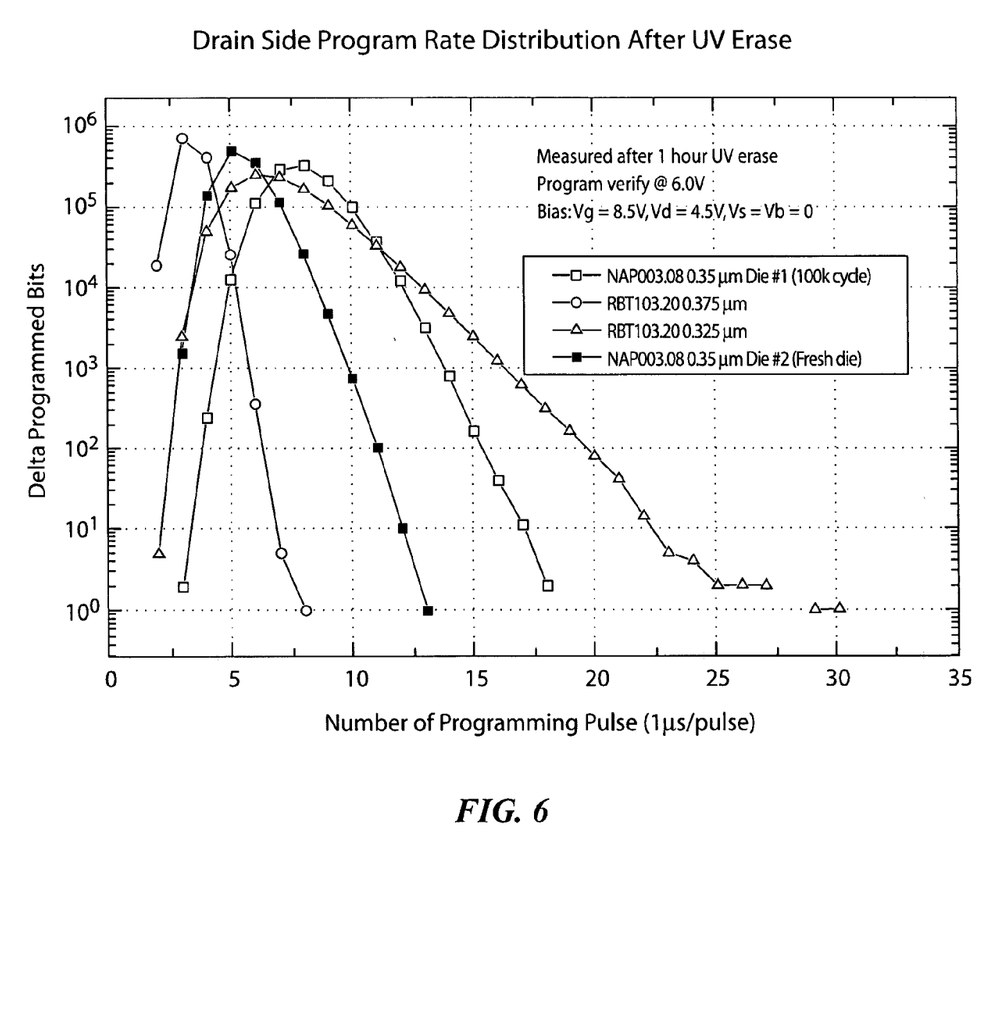
FIG. 6 shows a drain side program rate distribution for various flash memory arrays having different physical characteristics (e.g. channel length), incorporating cells similar to the memory cell shown in FIG. 3.
Figure 7:
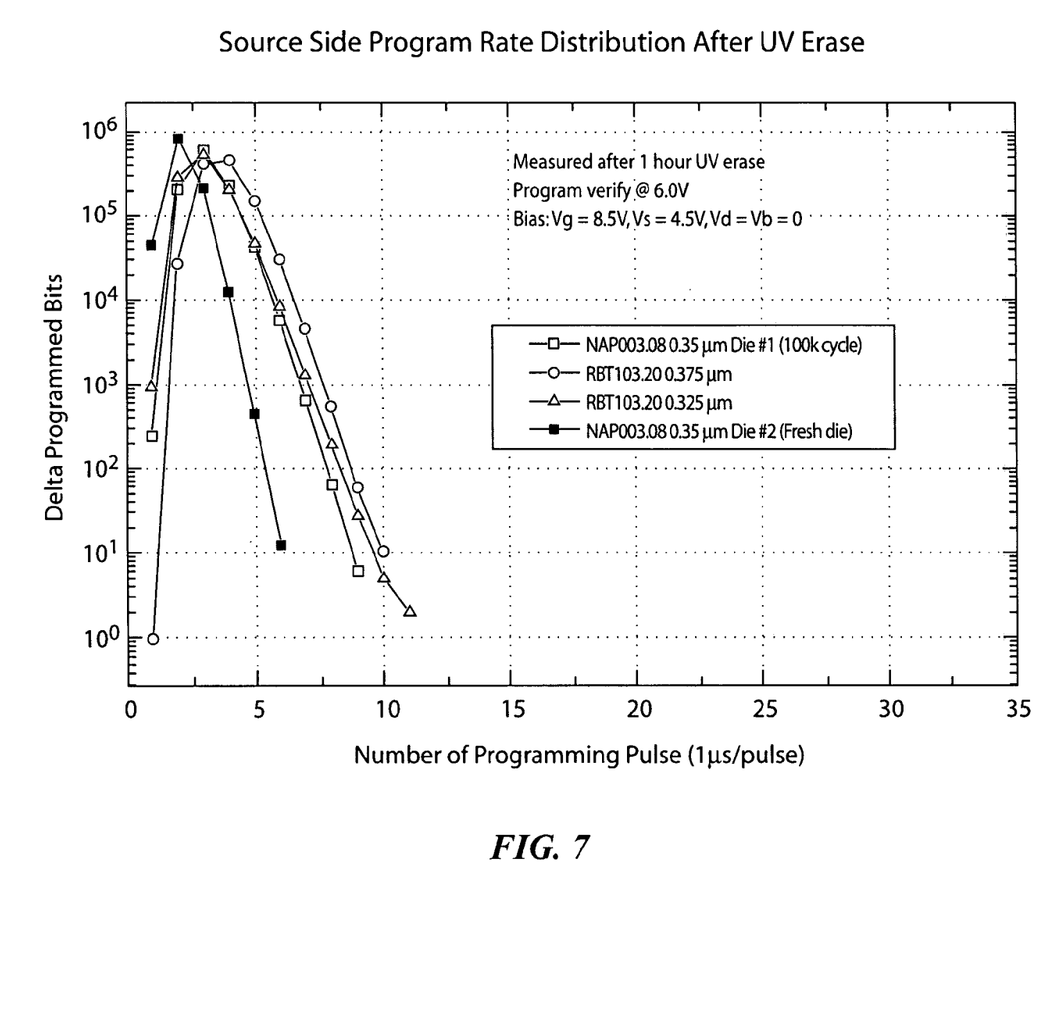
FIG. 7 shows a source side program rate distribution for various flash memory arrays having different physical characteristics (e.g. channel length), incorporating cells similar to the memory cell shown in FIG. 3, according to an embodiment of the present invention.

Referring now to FIGS. 6 and 7, there is shown a drain side program rate distribution and a source side program rate distribution for flash memory arrays incorporating cells similar to that shown in FIG. 3, respectively. Comparing FIGS. 6 and 7, it is seen that the programming rate distributions of various conditions (e.g. different channel lengths) for source side programming are within 10 programming time pulses, while programming rate distributions for drain side programming under the same conditions are as long as 30 pulses. The even faster source side programming for the NAP003.08 0.35 μm device is attributable to a higher Phosphorous implant dose.

Again comparing FIGS. 6 and 7, it is seen that the program rates for source side programming (FIG. 7) of devices having varying channel lengths is more tightly distributed than the program rates for drain side programming.

A benefit of having a shorter and better-controlled program distribution for source side programming is that the post-programming threshold voltage distribution for cells in the array is also tighter. This tighter threshold voltage distribution minimizes the amount of charge movement required to and from the floating gate. Consequently, wear and tear on the floating gate oxide is reduced so that the reliability of the device is enhanced. The relative independence of programming speed on channel length for source side programming is also important as it relates to the ability to reduce device dimensions.

Figure 8:
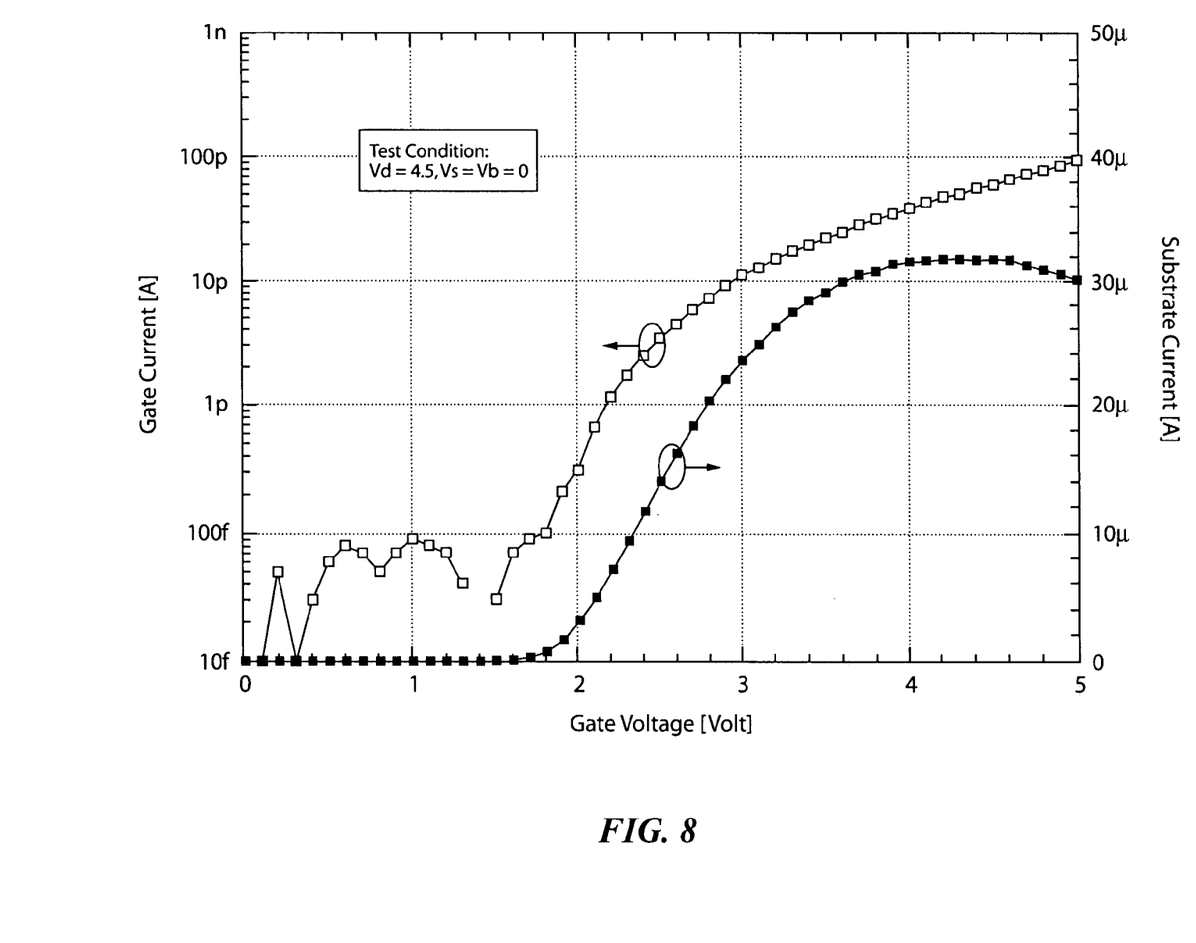
FIG. 8 shows gate and substrate currents for various drain biased flash memory arrays having different physical characteristics (e.g. channel length), incorporating cells similar to the memory cell shown in FIG. 3.
Figure 9:
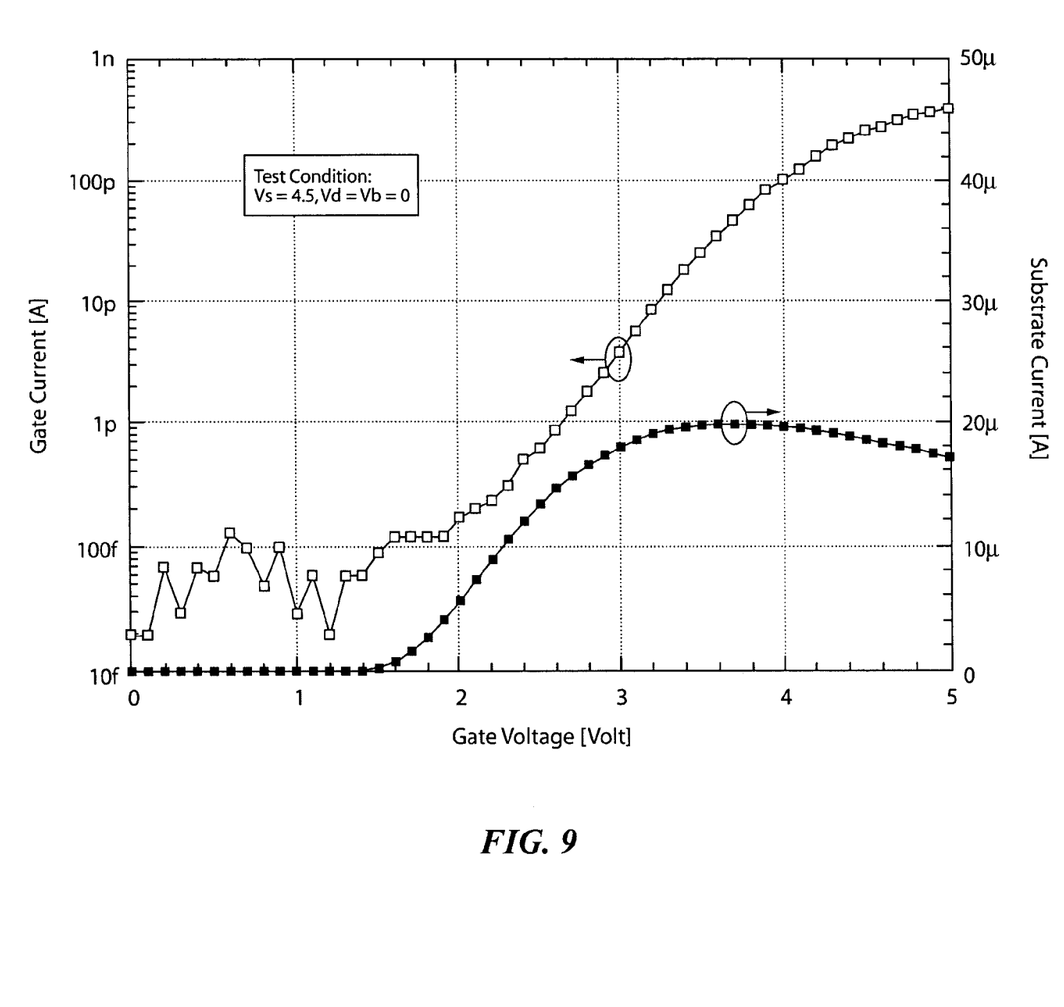
FIG. 9 shows gate and substrate currents for various source biased flash memory arrays having different physical characteristics (e.g. channel length), incorporating cells similar to the memory cell shown in FIG. 3, according to an embodiment of the present invention.

Referring now to FIGS. 8 and 9, there is shown experimental gate and substrate currents versus gate voltage for a device similar to that shown in FIG. 3, with the drain biased at about 4.5 volts (drain side programming) and the source biased at about 4.5 volts (source side programming), respectively. Comparing FIG. 8 to FIG. 9, it is seen that the substrate current under similar bias conditions for source side biasing is much smaller than that for drain side biasing. This is attributable to the more graded source junction relative to the abrupt junction formed by the drain and substrate. Another important distinction is that the gate current, $I_G$, which is a measure of the number of electrons injected into the floating gate per unit time, is higher in the range of $3.5 \leq V_G \leq 5$ volts for source side biasing than it is for drain side biasing. It is this higher gate current that is believed to be at least partially responsible for the faster programming speed for the source side biasing situation.

Although the invention has been described in terms of a specific structure, it will be obvious to those skilled in the art that many modifications and alterations may be made to the disclosed embodiment without departing from the invention. For example, one of skill in the art would understand that one could begin with an n-type substrate to manufacture a memory cell having doping characteristics opposite to that shown in FIG. 3. Also, the dimensions, doping concentrations, doping profiles etc. are for illustrative purposes only, are not absolute, and may be varied to change and/or enhance particular performance characteristics depending on the application involved. Hence, these modifications and alterations are intended to be within the spirit and scope of the invention as defined by the appended claims.

What is claimed is:

1. A flash memory, comprising: a plurality of memory cells, each memory cell having a single transistor having a single control gate, a single floating gate, a single drain and a single source, said plurality of memory cells arranged in an N-row by M-column array, where N and M are integers greater than or equal to one; N word lines, each word line connecting together the control gates of the transistors in a common and corresponding row; M bit lines, each bit line connecting together the drains of transistors in a common and corresponding column; wherein first and second memory cells of the plurality of memory cells are programmed by applying a first voltage to the respective control gates of the first and second memory cells, applying a second voltage to the respective sources of the first and second memory cells and grounding the respective drains of the first and second memory cells, wherein the sources of the first and second memory cells are coupled to a common node, wherein the sources of a plurality of memory cells are connected together to a common node, wherein each of the sources of the memory cells includes a first doped region of a first conductivity type and a second doped region of the first conductivity type to provide a graded profile that is less abrupt than the drain wherein the control gate is applied with a first voltage of 8.5 volts or less and the source region is applied with a second voltage of 4.5 volts or less to program the non-volatile device.

2. The flash memory of claim 1, wherein the sources of all memory cells are connected together as a common source.

3. The flash memory of claim 1, wherein the second voltage is greater than ground potential, wherein each memory cell defines a single transistor.

4. The flash memory of claim 1, wherein the source of each memory cell is defined within a semiconductor substrate having a second conductivity type of a charge opposite to the first conductivity type, thereby forming a first p-n junction.

5. The flash memory of claim 4, wherein the drain of each memory cell comprises a third doped region of the first conductivity type, which is laterally spaced from the first doped region and extends into the substrate, thereby forming a second p-n junction.

6. The flash memory of claim 1, wherein the first doped region comprises primarily of arsenic and the second doped region comprises primarily of phosphorous, the second doped region being provided below the first doped region, the first doped region having a doping concentration on the order of $10^{20}$ cm$^{-3}$.

7. The flash memory of claim 6, wherein the first doped region has a higher dopant concentration than the second doped region.

8. The flash memory of claim 7, wherein the floating gate of each memory cell is disposed vertically above and interposed between an oxide layer and the substrate such that the first doped region horizontally overlaps the floating gate to a greater extent than a horizontal overlap of the third doped region.

9. A non-volatile device, comprising:
a substrate;
a floating gate overlying the substrate;
a control gate overlying the floating gate and being electrically coupled to a word line extending in a first direction;
a drain region provided in the substrate and proximate a first end of the floating gate, the drain region extending into the substrate and having a first depth, the drain region having a first profile and being electrically coupled to a bit line extending in a second direction that is substantially perpendicular to the first direction; and
a source region provided in the substrate and proximate a second end of the floating gate, the source region and drain region defining a channel therebetween, the source region extending into the substrate and having a second depth that is greater than the first depth, the source region having a second profile,
wherein the first profile of the drain region has a more abrupt profile than the second profile of the source region,
wherein the control gate is applied with a first voltage of 8.5 volts or less and the source region is applied with a second voltage of 4.5 volts or less to program the non-volatile device,
wherein the floating gate, control gate, drain region, and source region together define a first memory cell, wherein the non-volatile device further includes a second memory cell including a source region that shares a common node with the source region of the first memory cell.

10. The device of claim 9, wherein the drain region is grounded to program the non-volatile device.

11. The device of claim 10, wherein the source region is a double-diffused region including first and second species of dopants.

12. The device of claim 11, wherein the first species is arsenic and the second species is phosphorous.

13. The device of claim 10, wherein an overlap between the source region and the floating gate is greater than an overlap between the drain region and the floating gate.

14. A non-volatile semiconductor device, comprising:
a semiconductor substrate; and
a memory cell formed on the substrate, the memory cell including:
a floating gate overlying a surface of the substrate,
a control gate overlying the floating gate and being electrically coupled to a first conductive line extending in a first direction,
drain region provided in the substrate and proximate a first end of the floating gate, the drain region extending a first distance into the substrate and having a first profile relative to the substrate, the drain region being electrically coupled to a second conductive line extending in a second direction that is substantially perpendicular to the first direction, and
a source region provided in the substrate and proximate a second end of the floating gate, the source region being a double-diffused region that extends a second distance into the substrate and having a second profile relative to the substrate, the second distance being greater than the first distance,
wherein the control gate is applied with a first voltage of no more than 8.5 volts and the source region is applied with a second voltage of no more than 4.5 volts to program the non-volatile device,
wherein the memory cell is defined by a single transistor.

15. The device of claim 14, wherein the drain is grounded to program the non-volatile device.

16. The device of claim 14, wherein the memory cell is one of a plurality of memory cells formed on the substrate, the plurality of cells being arranged in an array of N rows and M columns, each of the plurality of cells being configured to be programmed to at least a first conductive state or a second conductive state.

17. The device of claim 14, wherein source region includes first and second species of dopants.

18. The device of claim 17, wherein the first species is arsenic and the second species is phosphorous.

19. The device of claim 14, wherein the first distance is no more than 0.1 micron and the second distance is no more than 0.3 micron.

20. The device of claim 14, wherein the second distance is about three times greater than the first distance.

* * * * *